United States Patent [19]

Ohto et al.

[11] Patent Number: 4,987,016
[45] Date of Patent: Jan. 22, 1991

[54] COMPONENT FOR PRODUCING SEMICONDUCTOR DEVICES AND PROCESS OF PRODUCING IT

[75] Inventors: Takashi Ohto; Takashi Tanaka; Makoto Sato, all of Yamagata, Japan

[73] Assignee: Toshiba Ceramics Co., Ltd., Tokyo, Japan

[21] Appl. No.: 239,609

[22] Filed: Sep. 1, 1988

[30] Foreign Application Priority Data

Sep. 1, 1987 [JP] Japan .................................. 62-216490

[51] Int. Cl.$^5$ ................................................ B32B 3/00
[52] U.S. Cl. ..................................... 428/34.1; 428/332; 428/334; 428/688; 428/698; 428/699; 428/901; 156/89; 427/53.1; 427/96
[58] Field of Search ..................... 432/253, 258, 259; 428/332, 334, 34.1, 688, 698, 699, 901; 156/89; 427/53.1, 96

[56] References Cited

FOREIGN PATENT DOCUMENTS 045154 10/1985 Japan .
122212 6/1987 Japan .

OTHER PUBLICATIONS

CA 111(4): 32246m; Component for producing semiconductor devices and process; Ohto et al.; 1989.

*Primary Examiner*—Patrick Ryan
*Attorney, Agent, or Firm*—Foley & Lardner, Schwartz, Jeffery, Schwaab, Mack, Blumenthal & Evans

[57] ABSTRACT

A component for producing semiconductor devices such as a tube, a boat or the like, comprising a component body made of a silicon carbide material, a silica layer formed on a surface of the body and a CVD coating layer of silicon carbide formed on the silica layer. The silica layer has a thickness ranging between 0.1 and 5 microns. The CVD coating layer has a thickness ranging between 50 to 1000 microns.

15 Claims, 3 Drawing Sheets

COMPONENT FOR PRODUCING SEMICONDUCTOR DEVICES AND PROCESS OF PRODUCING IT

BACKGROUND OF THE INVENTION

This invention relates to a component for producing semiconductor devices and a process for producing the component, and especially to a component such as a process tube or a boat for containing and supporting wafers in a diffusion or CVD (Chemical Vapor Deposition) process.

In the past, components for producing semiconductor devices were mainly made of a silicon carbide (SiC) material.

Components made of silicon carbide for producing semiconductor devices have excellent strength but also have a lot of impurities in comparison with components made of quartz or silica glass (more than ten times as many).

Components made of such a silicon carbide material have high porosity and a poor sealing characteristic so that, when semiconductors are produced, the impurities contained inside the components contaminate the semiconductor devices. Among the impurities, alkali or the like can be effectively removed by a HF-HNO$_3$ treatment, but it is very difficult to remove heavy metals such as Fe. As is well-known, such impurities contaminate semiconductor devices when they are produced. In particular, a component, such as a boat semiconductor wafers directly contact is liable to contaminate devices by diffusion of impurities to a large extent.

In order to solve such defects, various improvements have been made. For example, as disclosed in Japanese Patent Publication No. 60-45154, there is proposed a refractory material having a composite-material layer formed on a heat-resistance body such as a silicon carbide body by a chemical vapor deposition method. For example, such a composite-material layer is formed of plural deposit-layers which are combinations of a silicon carbide layer and a silicon nitride layer.

Japanese Patent Laid-Open No. 62-122212 also proposes a component for semiconductor devices having a silica (SiO$_2$) layer of a thickness of 20 to 100,000 Å on a surface of a high purity Si-SiC body.

However, in conventional methods proposed to solve the above defects, the requirement of avoiding contamination and providing a high strength protection layer are not met. Especially, the component described in Japanese Patent Laid-Open No. 62-122212 doesn't have a strong surface because the surface is made of a silica layer. Also, the silica layer is liable to peel off because of its large thickness.

SUMMARY OF THE INVENTION

One object of the present invention is to provide a component for producing semiconductor devices in which diffusion of impurities can be effectively prevented.

Another object of the present invention is to provide process of producing the component.

In order to accomplish the above and other objects, the present invention includes a component for producing semiconductor devices, which comprises a component body made of silicon carbide (SiC) material, a silica (SiO$_2$) layer formed on a surface of the component body and having a thickness of 0.1 to 5 microns, and a CVD coating layer of silicon carbide (SiC) formed on the silica layer and having a thickness of 50 to 1000 microns.

In the present invention, "silicon carbide material" means material, such as silicon carbide (SiC) or silicon carbide-silicon (SiC-Si).

According to the present invention, the silica layer is combined with the CVD coating layer of silicon carbide for avoiding diffusion of impurities.

Because the surface of the component is made of silicon carbide, it is stronger than that of the component in Japanese Patent Laid-Open No. 62-122212. Also, because the silica layer is thinner than that of the component in Japanese Patent Laid-Open No. 62-122212, peeling of the silica layer owing to a difference of coefficients of thermal expansion isn't liable to happen.

If the thickness of the silica layer is less than 0.1 microns, the layer cannot trap impurities sufficiently to effectively avoid diffusion of the impurities. If the thickness of the silica layer is larger than 5 microns, the silica layer is apt to crack when semiconductor devices are produced. If the silica layer cracks, diffusion avoidance effects drastically decrease. Preferably, the thickness of the silica layer ranges between 1 to 3 microns.

The CVD coating layer of silicon carbide functions to reduce diffusion of impurities and exudation of silicon from the component. If the CVD coating layer has a thickness of less than 50 microns, it cannot function in this manner. If this layer has a thickness larger than 1000 microns, it is apt to crack in use.

The surface of the component body may be subjected to an oxidation treatment for forming the silica layer. The temperature of the oxidation treatment for forming the silica layer may range between 800° C. and 1400° C., preferably 1000° C. and 1300° C. in order to have a dense layer.

The component according to the present invention is especially suitable for a process tube, which is used for diffusion and CVD processing of wafers, and for a boat, which is used for supporting wafers.

BRIEF DESCRIPTION OF THE DRAWINGS

In FIG. 4, line 1 designates a relation between the thickness of the silica layer of the component and the content of Fe in semiconductor devices produced using the component. Line 2 denotes a relation between the thickness of the silica layer of the component and the life time of semiconductor devices produced using the component.

DETAILED DESCRIPTION OF THE PREFERRED EMBODIMENTS

Figure 1:
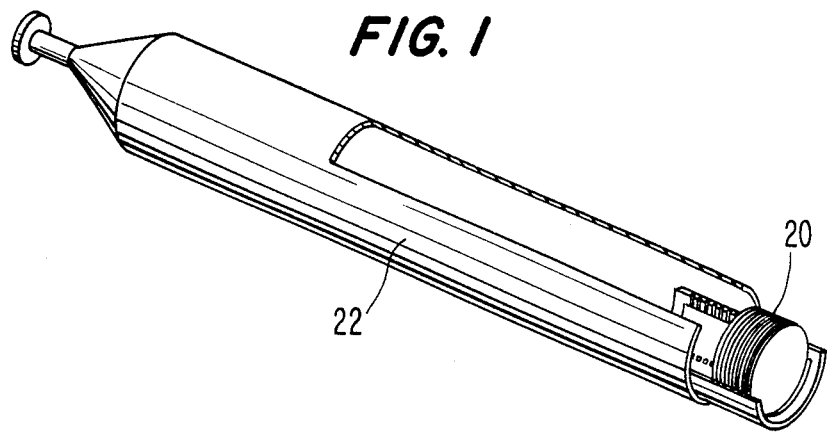
FIG. 1 is a perspective view of a process tube, partly broken away to show interior construction, of a preferred embodiment of this invention.

FIG. 1 shows a process tube 22 which contains a first embodiment of a boat 20 for containing wafers to be processed. The shapes of the boat 20 and process tube 22 are conventional, the material composition of these elements comprising the basis of the present invention, as will become clear for the description below.

Figure 2A:
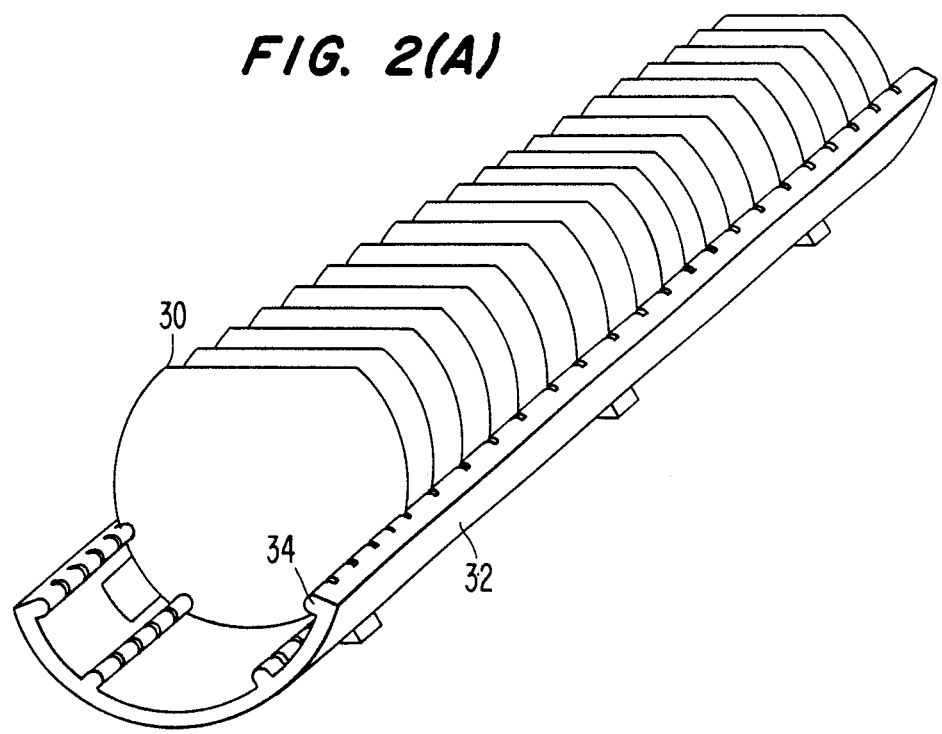
FIG. 2(A) is a perspective view of a boat of a preferred embodiment of this invention.
Figure 2B:
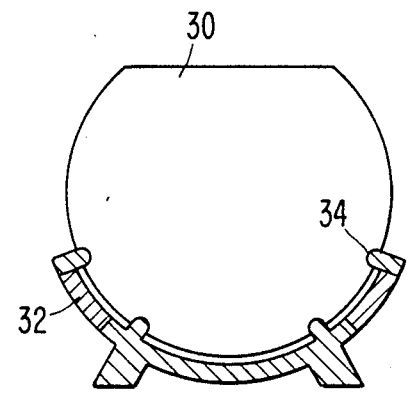
FIG. 2(B) is a longitudinal sectional view of the boat of FIG. 2(A).

FIGS. 2(A) and 2(B) show a second embodiment of a boat 32 according to the present invention. The boat 32 hold semiconductor wafers 30 to be processed in a conventional manner. Again, the shape of the boat 32 is conventional.

Figure 3:
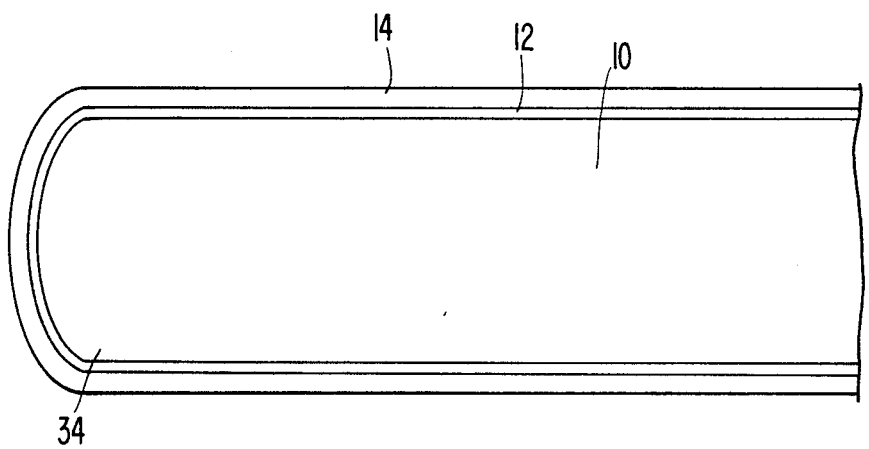
FIG. 3 is a greatly enlarged, partly sectional view of a portion of the boat of FIGS. 1(A) and 1(B) showing the arrangement of a component body, a silica layer and a coating layer of silicon carbide.

It will be seen in FIGS. 1(A) and 1(B) that the boat 32 has a plurality of support fingers 34 which actually support the wafers 30 and hold them in place. FIG. 3 shows a greatly enlarged cross section of one of these support fingers in order to make clear the material construction of this component. It will be understood that the structure of FIG. 3 is exemplary of the construction of the boats 20, 32 and the process tube 22. In this figure, it can be seen that the element depicted comprises a component body 10 which preferably is made of silicon carbide material. A silica layer 12 is formed over the component body 10 and a high purity silicon carbide layer 14 is formed over the silica layer 12. Again, it should be understood that the entire boat 32 is formed in this manner, as is the boat 20 and the process tube 22.

According to the present invention, as the silica layer 12 is increased in thickness on the surface of the component body 10, made of silicon carbide material, the diffusion of impurities from the component body 10 during semiconductor wafer processing is more greatly reduced. In this regard, it should be understood that the component body 10, made of a silicon carbide material, may contain 20 to 50 ppm of Fe as an impurity even after purification treatment. This Fe will diffuse into semiconductor wafers processed using the component unless steps are taken to prevent this diffusion.

According to the present invention, The high purity silicon carbide layer 14 (for example 2~3 ppm of Fe) is formed on the silica layer 12 as a sufficiently thick CVD coating layer (for example, a thickness of 600 microns). The CVD layer acts as a secondary barrier to the diffusion of Fe and provides strength to the component. The Fe which the silica layer 12 could not trap is prevented from going through the CVD coating layer 14 and into a furnace in use. In particular, in the case of a component such as boat 32 which semiconductor devices directly contact, the reduction in diffusion of impurities is remarkable.

To further illustrate this invention, and not by way of limitation, the following examples are given.

EXAMPLE 1

A boat body made of silicon carbide for producing semiconductor devices was arranged within a furnace. While oxygen gas was flowed through the furnace at 1.4 l/min., the boat body was subjected to an oxidation treatment at 1200° C. for 15 hours. As a result, a silica layer of 1 micron thickness was formed on the surface of the boat body. After that, a CVD coating layer of silicon carbide was formed on the surface of the silica layer by a CVD coating method, preferably, under vacuum.

The CVD layer was formed based on the process disclosed in Japanese Patent Laid-Open No. 54-90967. The boat body was vertically set in a cylindrical graphite electrode which was placed within an outer shell in a sealed condition. Silane gas such as trichlormethylene silane gas containing carbon was flowed into the electrode toward a lower end of the boat body at a flow rate of 4 ml/min. while hydrogen gas was flowed as a carrier gas at 4000 ml/min. At the same time, the pressure around the boat body was decreased to 70 Torr. Next, the boat body was heated by an induction heater so that a reacted substance was formed on the surface of the component thereby to form a CVD coating layer of silicon carbide having a thickness of 500 microns.

EXAMPLE 2

A boat body made of silicon carbide for producing semiconductor devices was set in a furnace. While oxygen gas was flowed therein at 1.4 l/min., the boat body was subjected to an oxidation treatment at 1200° C. for 30 hours. As a result, a silica layer of 2-micron thickness was formed on a surface of the boat body. A CVD coating layer of silicon carbide with a thickness of 500 microns was formed thereon as in Example 1.

EXAMPLE 3

A boat body made of silicon carbide for producing semiconductor devices was set in a furnace. While oxygen gas was flowed therein at 1.4 l/min., the boat body was subjected to an oxidation treatment at 1200° C. for 45 hours. As a result, a silica layer of 3-micron thickness was formed on a surface of the boat body. In addition, a CVD coating of silicon carbide with a thickness of 500 microns was formed thereon as in Example 1.

It will be understood from the foregoing that the thickness of the silica layer is 1 micron (Example 1), 2 microns (Example 2) or 3 microns (Example 3) if the oxidation treatment time for forming the silica layer is 15 hours (Example 1), 30 hours (Example 2) or 45 hours (Example 3), respectively.

Figure 4:
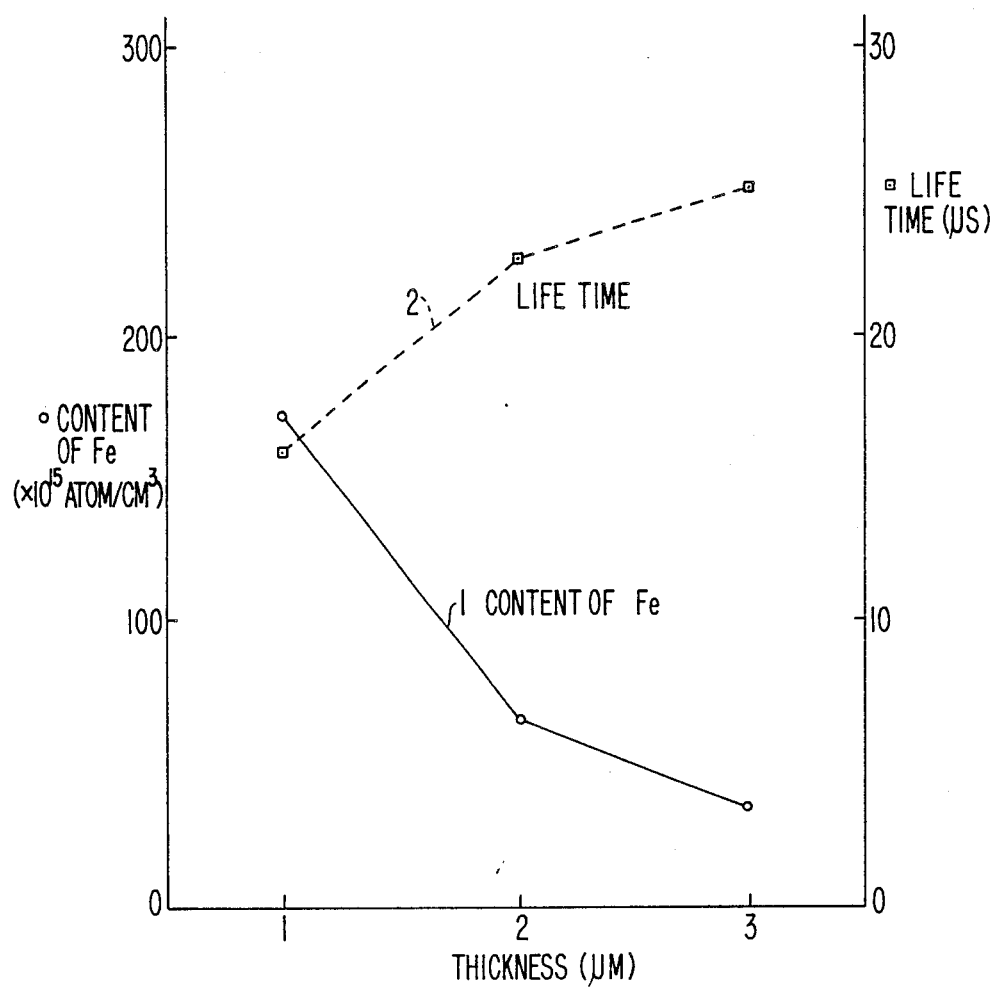
FIG. 4 is a graph showing characteristics of a component for producing semiconductor devices according to the present invention.

If boats having equal thickness CVD coatings of silicon carbide formed on silica layers varying in the thickness from 1 to 3 μm are used for the diffusion treatment of semiconductor devices, the content of Fe in the processed waters is always less than $200 \times 10^{15}$ atom/cm$^3$ as designated by line 1 in FIG. 4. FIG. 4 shows the results for boats having silica layer thicknesses of 1 μm, 2 μm and 3 μm, respectively, with line being interpolated therebetween. The life time of semiconductor wafers processed using these boats increases as the oxidation treatment time (and therefore the silica FIG. 4. Line 2 shows the processed wafer lifetime for boat silica thicknesses of 1, 2 and 3 μm with line 2 interpolated therebetween.

What is claimed is:

1. A component, for producing semiconductor devices, comprising:
    a component body made of a silicon carbide material;
    a silica layer formed on a surface of the component body and having a thickness of 0.1 to 5 microns; and
    a coating layer of silicon carbide formed on the silica layer and having a thickness of 50 to 1000 microns and less than 20 ppm of Fe.

2. A component according to claim 1, wherein the thickness of the silica layer ranges between 1 and 3 microns.

3. A component according to claim 1, wherein the surface of the component body is subjected to an oxidation treatment for forming the silica layer.

4. A component according to claim 3, wherein a temperature of the oxidation treatment for forming the silica layer ranges between 800° C. and 1400° C.

5. A component according to claim 4, wherein the temperature ranges between 1000° C. and 1300° C.

6. A component according to claim 1, wherein the component is a process tube for diffusion and CVD processing of semiconductor wafers.

7. A component according to claim 1, wherein the component is a boat for supporting semiconductor wafers.

8. A component according to claim 1, wherein said coating layer of silicon carbide is formed by CVD.

9. A process for producing a component, for producing semiconductor devices, comprising steps:
forming a silica layer having a thickness of 0.1 to 5 microns on a surface of a component body;
forming a coating layer of silicon carbide having a thickness of 50 to 1,000 microns on the silica layer and having less than 20 ppm of Fe.

10. A process according to claim 9, wherein the surface of the component body is subjected to an oxidation treatment for forming the silica layer.

11. A process according to claim 10, wherein the temperature of oxidation treatment for forming the silica layer ranges between 800° C. and 1,400° C.

12. A process according to claim 11, wherein the temperature ranges between 1,000° C. and 1,300° C.

13. A process according to claim 9, wherein the coating layer of silicon carbide is formed by CVD.

14. A component according to claim 1 wherein said coating layer of silicon carbide has less than 3 ppm of Fe.

15. A process according to claim 9 wherein the coating layer of silicon carbide is formed with less than 3 ppm of Fe.

* * * * *